United States Patent
Watanabe

(10) Patent No.: US 11,237,228 B2
(45) Date of Patent: Feb. 1, 2022

(54) MAGNETIC SENSOR

(71) Applicant: TDK Corporation, Tokyo (JP)

(72) Inventor: Kazuya Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 20 days.

(21) Appl. No.: 16/216,082

(22) Filed: Dec. 11, 2018

(65) Prior Publication Data

US 2019/0195966 A1    Jun. 27, 2019

(30) Foreign Application Priority Data

Dec. 27, 2017    (JP) .............................. JP2017-250477

(51) Int. Cl.
*G01R 33/09* (2006.01)
*G01R 33/00* (2006.01)
*G11B 5/39* (2006.01)

(52) U.S. Cl.
CPC ....... *G01R 33/091* (2013.01); *G01R 33/0017* (2013.01); *G01R 33/093* (2013.01); *G01R 33/098* (2013.01); *G11B 5/3906* (2013.01); *G11B 5/398* (2013.01)

(58) Field of Classification Search
CPC .. G01R 33/09; G01R 33/091; G01R 33/0017; G01R 33/00; G01R 33/093; G01R 33/095; G01R 33/097; G01R 33/098; G11B 5/398; G11B 5/39; G11B 5/3906; G01B 7/02; G01B 7/00; H01L 43/08
See application file for complete search history.

(56) References Cited

U.S. PATENT DOCUMENTS

| 2010/0156405 | A1* | 6/2010 | Furukawa | B82Y 25/00 324/252 |
| 2010/0259257 | A1* | 10/2010 | Sasaki | B82Y 25/00 324/252 |
| 2016/0266218 | A1* | 9/2016 | Tanabe | G01R 33/0005 |
| 2017/0261347 | A1 | 9/2017 | Nagata et al. | |

FOREIGN PATENT DOCUMENTS

| CN | 103852592 A | 6/2014 |
| CN | 105974338 A | 9/2016 |
| CN | 107179096 A | 9/2017 |
| EP | 3 467 529 A1 | 4/2019 |
| JP | H11-087804 A | 3/1999 |
| JP | 2009-300150 A | 12/2009 |
| JP | 2015-219227 A | 12/2015 |
| WO | 2017/204151 A1 | 11/2017 |

* cited by examiner

*Primary Examiner* — Son T Le
(74) *Attorney, Agent, or Firm* — Posz Law Group, PLC

(57) ABSTRACT

A magnetic sensor of the present invention has an elongate element portion having a magnetoresistive effect and a pair of elongate soft magnetic bodies that are arranged along the element portion on both sides of the element portion with regard to a short axis thereof. Each soft magnetic body includes a central portion that is adjacent to the element portion from one end to another end of the element portion with regard to a long axis direction thereof and a pair of end portions that protrude from the central portion in the long axis direction. A width of at least one of the end portions gradually decreases in a direction away from the central portion in at least a part of the end portions in the long axis direction thereof.

14 Claims, 15 Drawing Sheets

MAGNETIC SENSOR

BACKGROUND OF THE INVENTION

Field of the Invention

The present application is based on, and claims priority from, JP Application No. 2017-250477, filed on Dec. 27, 2017, the disclosure of which is hereby incorporated by reference herein in its entirety.

The present invention relates to a magnetic sensor.

Description of the Related Art

As a sensor for detecting the position of a moving object, a magnetic sensor that has an element having a magnetoresistive effect is known (see JPH11-87804). A magnetic sensor moves relative to a magnet and thereby detects a change in an external magnetic field that is generated by the magnet, and calculates the moving distance of the moving object based on the change in the external magnetic field that is detected.

The magnetic sensor that is disclosed in JPH11-87804 has a giant magnetoresistive thin film that exhibits a magnetoresistive effect and soft magnetic thin films, as shown in FIG. 1 thereof. In the magnetic sensor, the giant magnetoresistive thin film is elongate, and the soft magnetic thin films are provided on both sides of the giant magnetoresistive thin film with regard to the short axis direction thereof. The giant magnetoresistive thin film is rectangular, as viewed in the thickness direction thereof. In this magnetic sensor, the giant magnetoresistive thin film, which has poor sensitivity to a magnetic field, is combined with soft magnetic thin films in order to enhance the sensitivity to a magnetic field.

SUMMARY OF THE INVENTION

As disclosed in JPH11-87804, the sensitivity of a magnetic sensor is enhanced by providing soft magnetic thin films on both sides of the giant magnetoresistive thin film. In this arrangement, the sensitivity of a magnetic sensor is further enhanced as the soft magnetic thin films (soft magnetic bodies) become wider.

However, output noise in the long axis direction of the giant magnetoresistive thin film, which is perpendicular to the direction of a magnetically sensitive axis in a magnetic field (in this case, the direction of a short axis of the giant magnetoresistive thin film), increases as the soft magnetic thin films (soft magnetic bodies) become wider.

The present invention aims at providing a magnetic sensor that is capable of reducing output noise in the long axis direction in a magnetic field while enhancing the sensitivity.

A magnetic sensor of the present invention comprises: an elongate element portion having a magnetoresistive effect; and a pair of elongate soft magnetic bodies that are arranged along the element portion on both sides of the element portion with regard to a short axis thereof. Each soft magnetic body includes a central portion that is adjacent to the element portion from one end to another end of the element portion with regard to a long axis direction thereof and a pair of end portions that protrude from the central portion in the long axis direction. A width of at least one of the end portions gradually decreases in a direction away from the central portion in at least a part of the end portions in the long axis direction thereof.

According to the invention, it is possible to provide a magnetic sensor that is capable of reducing output noise in the long axis direction in a magnetic field while enhancing the sensitivity.

The above and other objects, features and advantages of the present invention will become apparent from the following descriptions with reference to the accompanying drawings which illustrate examples of the present invention.

DETAILED DESCRIPTION OF EMBODIMENTS

Explanation will be given about an embodiment, as well as modifications of the embodiment.

Magnetic sensor 10 of the embodiment is, for example, a sensor for detecting the position of a moving object (not shown) having a magnet, that is, a position sensor. Magnetic sensor 10 of the embodiment is configured to move relative to the above-mentioned magnet and thereby to detect a change in an external magnetic field that is generated by the magnet, and to calculate the moving distance of the moving object based on the change that is detected. Magnetic sensor 10 of the embodiment has a magnetically sensitive axis, which is the X axis in FIGS. 1A and 10, and detects a change in a magnetic field in the X axis direction that is generated by the moving object. In the following descriptions, the X axis in FIGS. 1A and 10, i.e., the axis parallel to the short axes of element portion 20 and soft magnetic body 30, is referred to as a first axis, and the Y axis in FIGS. 1A and 10, i.e., the axis parallel to the long axes of element portion 20 and soft magnetic body 30, is referred to as a second axis.

Figure 1A:
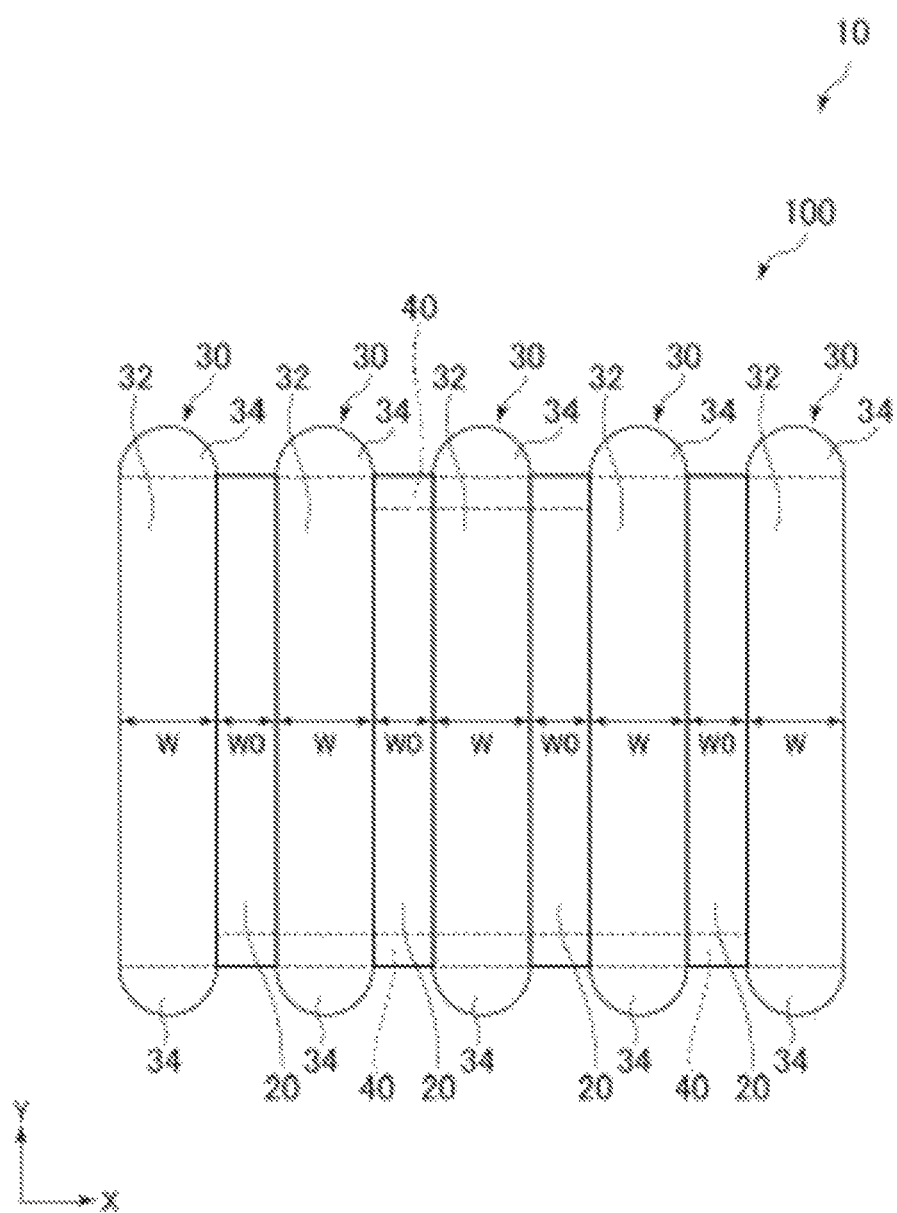
FIG. 1A is a plan view of the main portion of a magnetic sensor according to an embodiment.
Figure 1B:
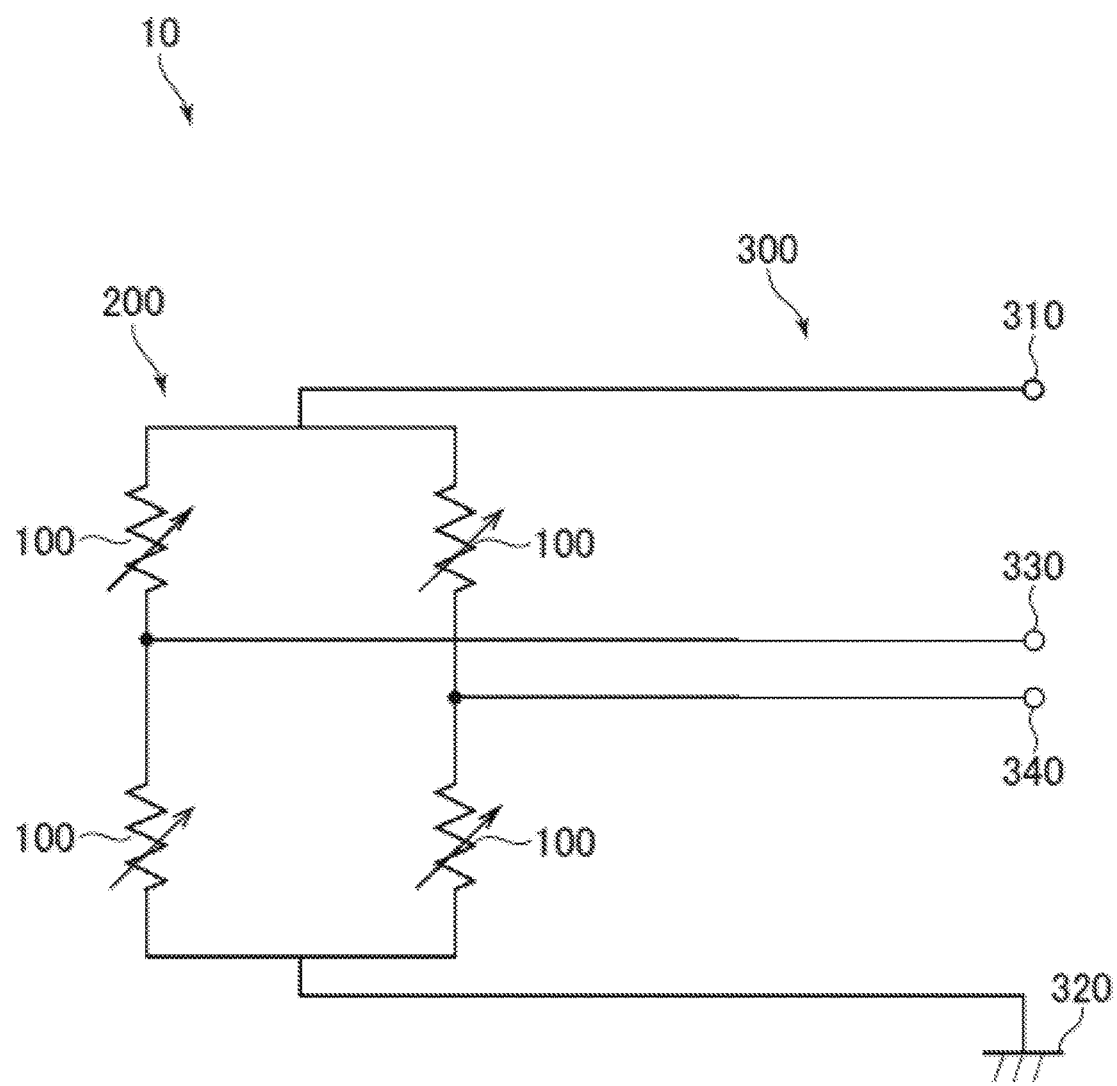
FIG. 1B is a circuit diagram of the magnetic sensor according to the embodiment.

Magnetic sensor 10 of the embodiment has magnetoresistive element portion 100 that is constructed by element portion 20 and a pair of soft magnetic bodies 30, as shown in FIGS. 1A and 10. As shown in FIG. 1B, magnetic sensor 10 of the embodiment has sensor portion 200, in which magnetoresistive element portions 100 are bridge-connected to each other, and integrated circuit 300 having input terminal 310 that is electrically connected to sensor portion 200, ground terminal 320 and external output terminals 330, 340 etc.

Element portion 20 is, for example, elongate and includes a material that has a magnetoresistive effect, later described. A pair of soft magnetic bodies 30 is, for example, elongate and is arranged on both sides of element portion 20 with regard to the short axis thereof. Element portions 20 and soft magnetic bodies 30 are arranged alternately in the short axis direction of element portions 20 such that soft magnetic bodies 30 are arranged on both sides of element portions 20, as shown in FIG. 1A. Element portions 20 are connected to each other at one end and the other end thereof with regard to the long axis direction thereof by means of electrodes 40, forming a meander shape together with electrodes 40. Element portions 20 and soft magnetic bodies 30 are arranged above a substrate (not shown).

Element portion 20 of the embodiment is, for example, elongate, as viewed in the thickness direction thereof, which is perpendicular both the long axis direction and to the short axis direction of element portion 20.

Figure 1C:
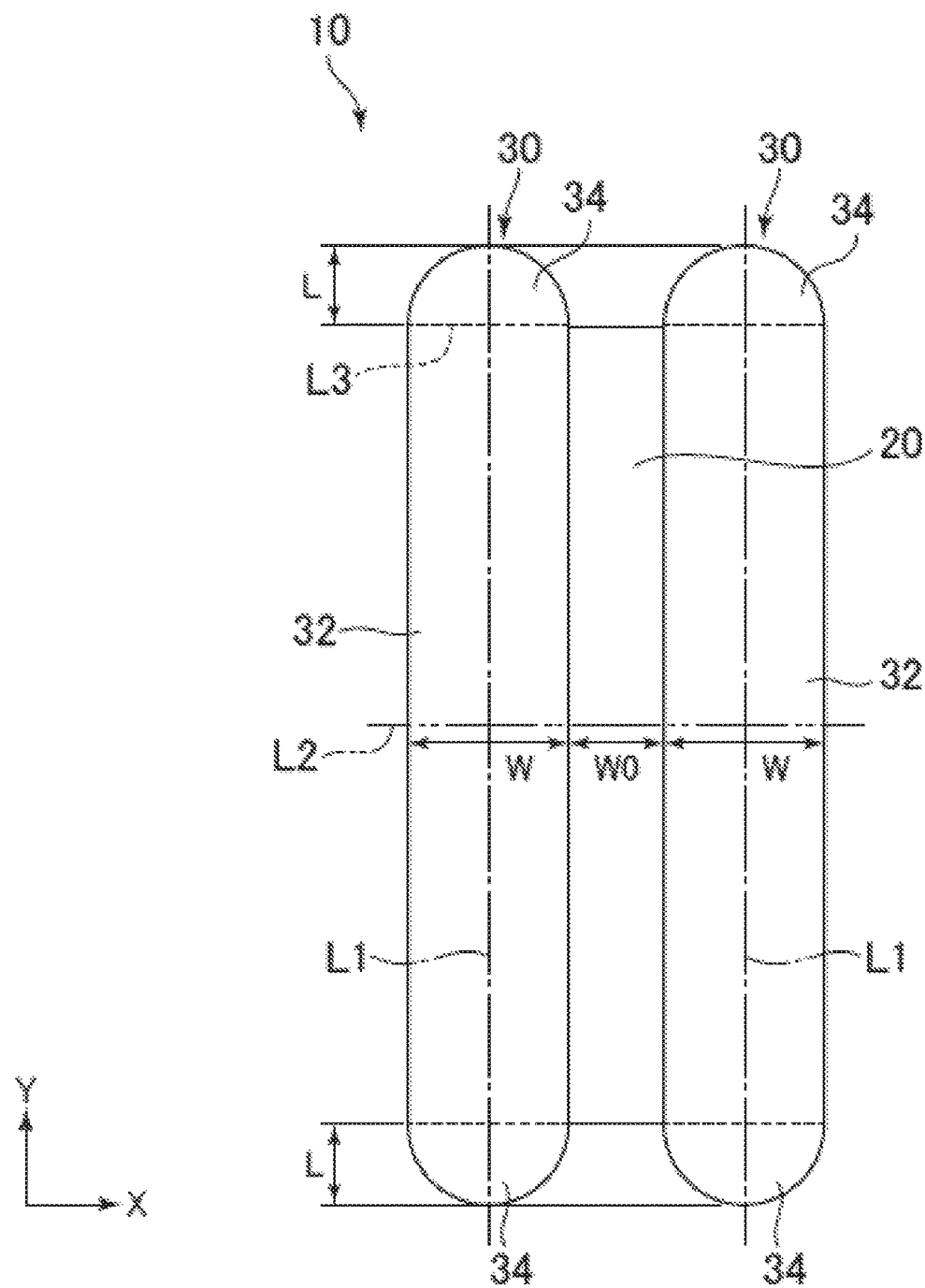
FIG. 1C is a partial plan view of the main portion of the magnetic sensor according to the embodiment.
Figure 1D:
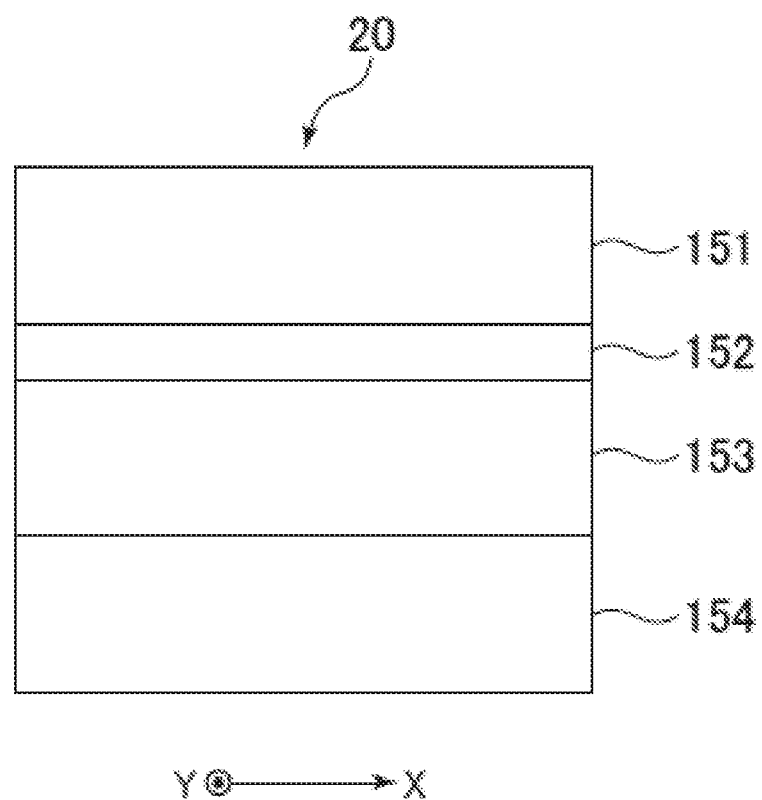
FIG. 1D is a sectional view of an element portion that constitutes the main portion of the magnetic sensor according to the embodiment.

Element portion 20 of the embodiment has, for example, a typical spin-valve type film configuration, as shown in FIG. 1D. Specifically, element portion 20 includes free layer 151 whose magnetization direction is changed depending on an external magnetic field, pinned layer 153 whose magnetization direction is pinned relative to the external magnetic field, spacer layer 152 that is positioned between and that is in contact both with free layer 151 and with pinned layer 153, antiferromagnetic layer 154 that is adjacent to pinned layer 153 on the back side thereof, as viewed from spacer layer 152. Free layer 151, spacer layer 152, pinned layer 153 and antiferromagnetic layer 154 are stacked above the above-mentioned substrate. Antiferromagnetic layer 154 fixes the magnetization direction of pinned layer 153 by the exchange coupling with pinned layer 153. Pinned layer 153 may also have a synthetic structure in which two ferromagnetic layers sandwich a nonmagnetic intermediate layer. Spacer layer 152 is a tunneling barrier layer that is formed of a nonmagnetic insulator, such as $Al_2O_3$. Accordingly, element portion 20 of the embodiment functions as a tunneling magnetoresistive element (a TMR element). In other words, element portion 20 of the embodiment has a tunneling magnetoresistive effect. A TMR element is advantageous in that it has a larger MR ratio and a larger output voltage from the bridge circuit, for example, than a GMR element.

As shown in FIG. 1C, each soft magnetic body 30 of the embodiment is, for example, in line symmetry with regard to imaginary straight line L1 (the dot-dash line) that passes through the center thereof with regard to the short axis direction and that extends in the long axis direction and also is in line symmetry with regard to imaginary straight line L2 (the two-dot chain line) that passes through the center thereof with regard to the long axis direction and that extends in the short axis direction. In other words, each soft magnetic body 30 (including the shapes of end portions 34) is in line symmetry both with regard to the long axis thereof and with regard to the short axis thereof, as viewed in a direction perpendicular both the long axis direction thereof and to the short axis direction thereof.

The pair of soft magnetic body 30, which is arranged on both sides of element portion 20, as mentioned above, has the function of enhancing the sensitivity of magnetic sensor 10 or the function as a yoke. Each soft magnetic body 30 of the embodiment is formed, for example, of NiFe, CoFe, CoFeSiB, CoZrNb or the like. As shown in FIG. 1C, soft magnetic bodies 30 are arranged on both sides of element portion 20 with regard to the short axis direction thereof and protrude outwards of both tip ends of element portion 20 with regard to the long axis direction thereof. In the following descriptions, a portion of soft magnetic body 30 that is adjacent to element portion 20 along element portion 20 from one end to the other end of element portion 20 with regard to the long axis direction thereof is referred to as central portion 32, and a pair of portions of soft magnetic body 30 that protrude from central portion 32 in the long axis direction of element portion 20 is referred to as end portions 34 (see FIG. 1C).

As shown in FIG. 1C, width W of central portion 32 is, for example, larger than width W0 of element portion 20, which makes magnetic sensor 10 of the embodiment more sensitive than a magnetic sensor in which width W of central portion 32 is equal to or less than width W0 of element portion 20. Central portion 32, which is a portion of soft magnetic body 30 other than both end portions 34 with regard to the long axis direction thereof, is rectangular, as viewed in the thickness direction (see FIG. 1C).

Length L of each end portion 34. i.e., the protruding length from the boundary with central portion 32 is, for example, equal to or less than width W of central portion 32.

For example, there is a relationship that is expressed by formula (1) between length L of each end portion 34 and width W of central portion 32

$$W/2 = < L \qquad \text{(formula 1)}$$

Figure 2A:
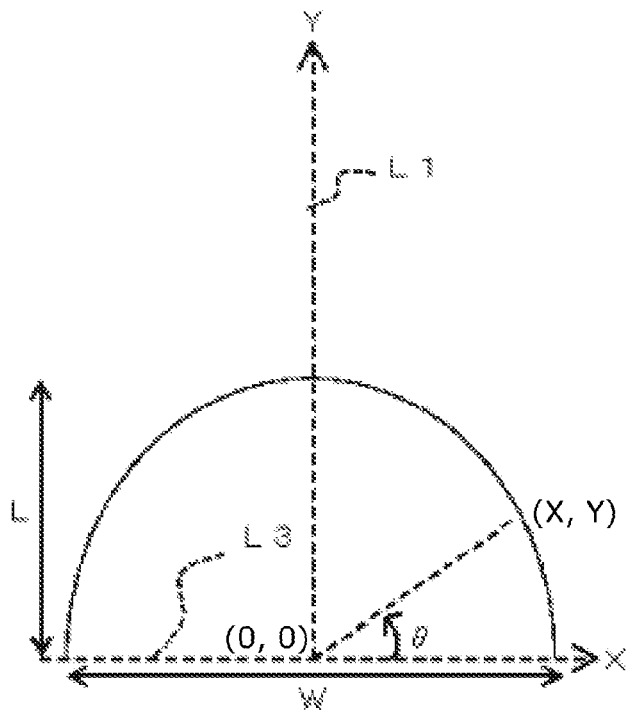
FIGS. 2A to 2D are plan views illustrating examples of various shapes (a first to fourth shapes) of an end portion of a soft magnetic body that constitutes the main portion of the magnetic sensor of the embodiment, respectively.
Figure 2B:
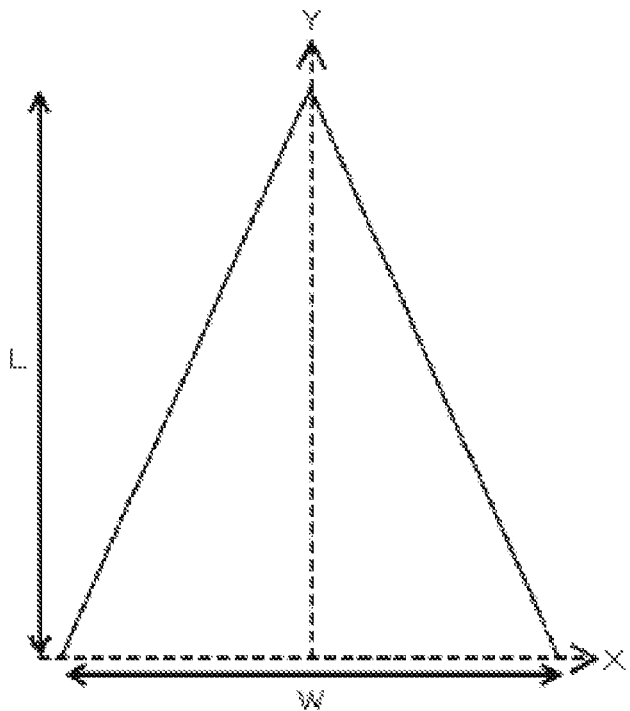
Figure 2C:
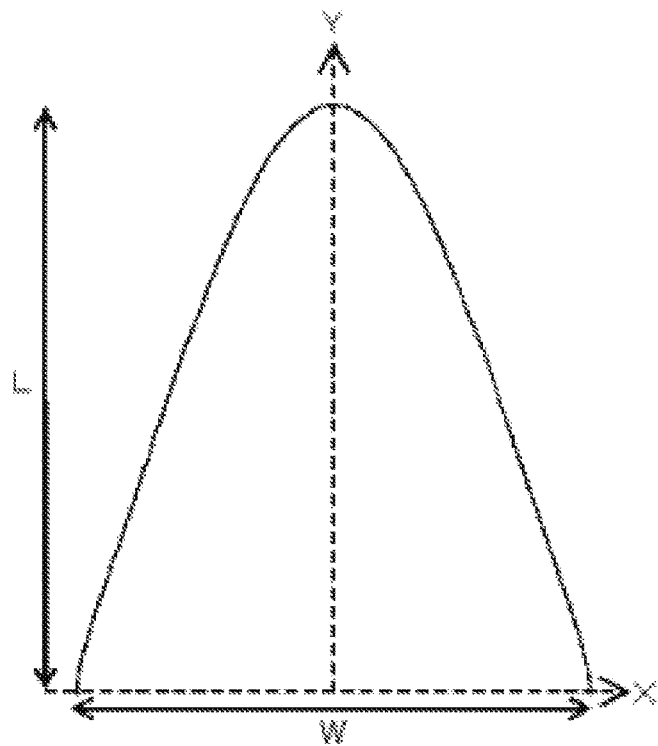

In the present embodiment, the width of each end portion 34 gradually decreases as the distance from central portion 32 in the long axis direction of element portion 20 increases and becomes zero at the tip end, as shown in FIG. 1C. Specifically, the edge of each end portion 34 is expressed by the curve that is stipulated by formula (2) in the first quadrant of a Cartesian coordinate and by a curve that is in line symmetry with the curve of formula (2) with regard to the Y axis (imaginary straight line L1) in the second quadrant of the Cartesian coordinate, as viewed in a direction that is perpendicular both to the long axis direction and to the short axis direction of element portion 20, wherein in the Cartesian coordinate, the coordinates of the middle point of imaginary boundary line L3 (see FIGS. 1C and 2A) between end portion 34 and central portion 32 are (0,0), imaginary boundary line L3 is the X axis, and imaginary straight line L1 that passes through the coordinates of the middle point and extends in the long axis direction is the Y axis.

$$(X, Y) = (W/2 \times \cos\theta, L \times \sin(\theta + P \times \sin(2\theta))) \qquad \text{(formula 2)}$$

where
W : the width of central portion 32
L : the length of end portion 34
P : strain angle, for example, $-20° \leq P \leq +30°$
θ: angle in the Cartesian coordinate system (see FIG. 2A),
The angle θ is between the imaginary boundary line L3 and a line extending between the middle point (0,0) and (X,Y) as shown in FIG. 2A.

In the present embodiment, the edge of each end portion 34 is expressed by substituting the following numerical values into formula (2) and is shaped into a first shape, as shown in the first quadrant of FIG. 2A.

W=2000 (nm)
L=1000 (nm)
P=0 (°)

In the embodiment, the chamfering rate (%) of end portions 34 is, for example, 5(%) or more, as viewed in a direction that is perpendicular both to the X axis direction and to the Y axis direction. In the following description, a direction that is perpendicular both to the X axis direction and to the Y axis direction is referred to as a Z axis. The Z axis corresponds to a direction that is perpendicular both to the long axis direction and the short axis direction of element portion 20 and each soft magnetic body 30.

Figure 1E:
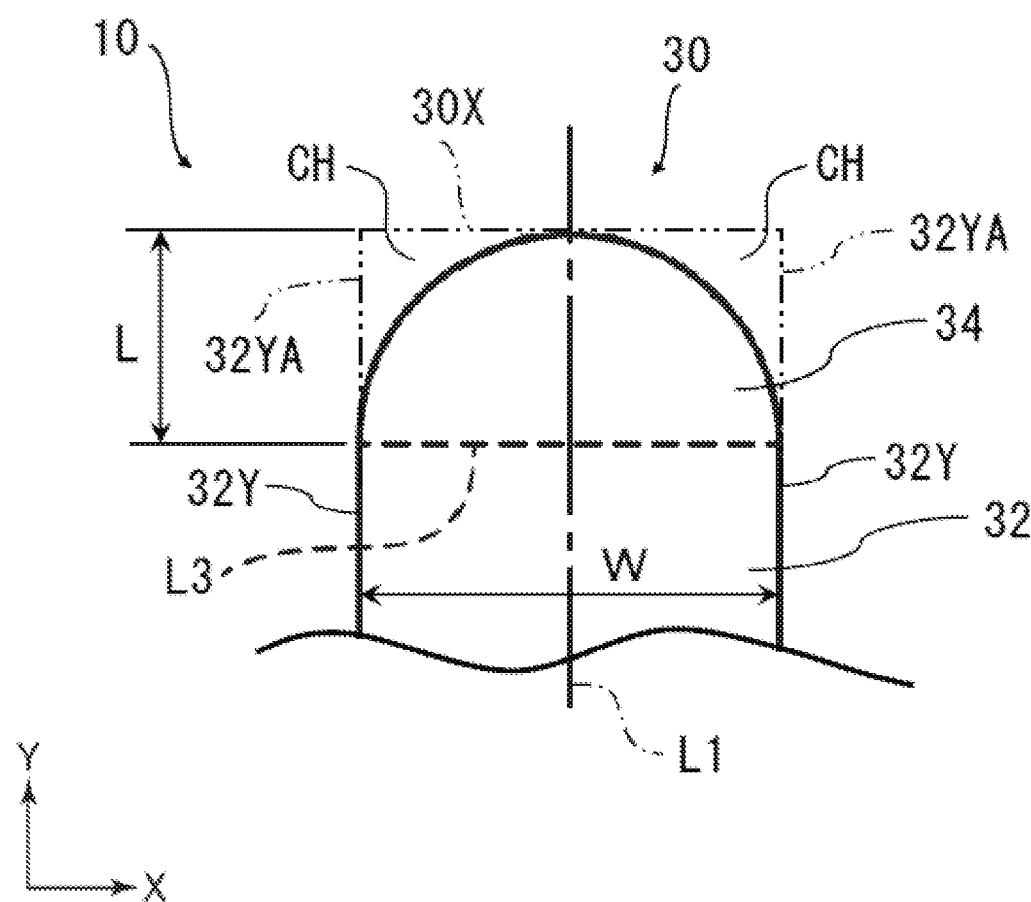
FIG. 1E is an enlarged plan view of FIG. 1C illustrating an end portion and its vicinity.

The chamfering rate (%) is defined as follows. As viewed in the Z axis direction in FIG. 1E, suppose that sides of central portion 32 along the long axis direction are sides 32Y and that an imaginary line that passes through the tip end of end portions 34, i.e., the tip end of soft magnetic body 30 with regard to the long axis direction thereof, that is perpendicular to sides 32Y and that extends in the X axis direction between extensions of both sides 32Y is imaginary line 30X. Further, suppose that a part of extensions of both sides 32Y that connect central portion 32 to respective ends of imaginary line 30X are imaginary lines 32Y. Further, suppose that the area of portion CH that is defined by both imaginary lines 32YA, imaginary line 30X and the edge of end portion 34, i.e., a value obtained by subtracting the area of end portion 34 from the area of the minimum rectangular region that envelops end portion 34 is chamfering area S1, and a product of length L of end portions 34 and width W of central portion 32, i.e., the area of the minimum rectangular region that envelops end portion 34 is area S2 of end portion 34 before chamfered, as viewed in the Z axis direction. Then, chamfering rate R (%) is expressed as formula (3)

$$R=S1/S2\times 100(\%) \qquad \text{(formula 3)}$$

Figure 3:
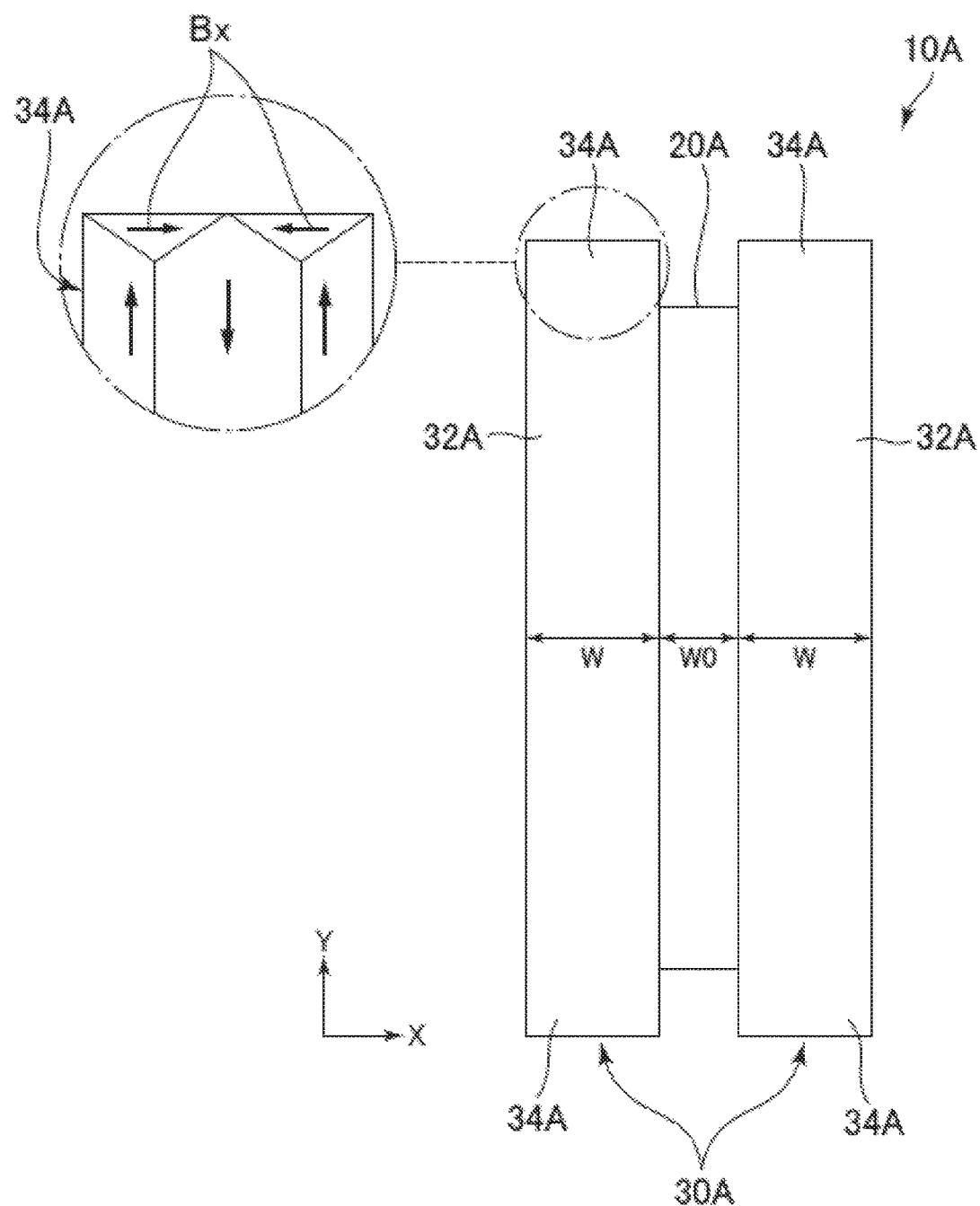
FIG. 3 is a schematic plan view of the main portion of a magnetic sensor according to a comparative example, illustrating the mechanism of generating output noise.
Figure 4:
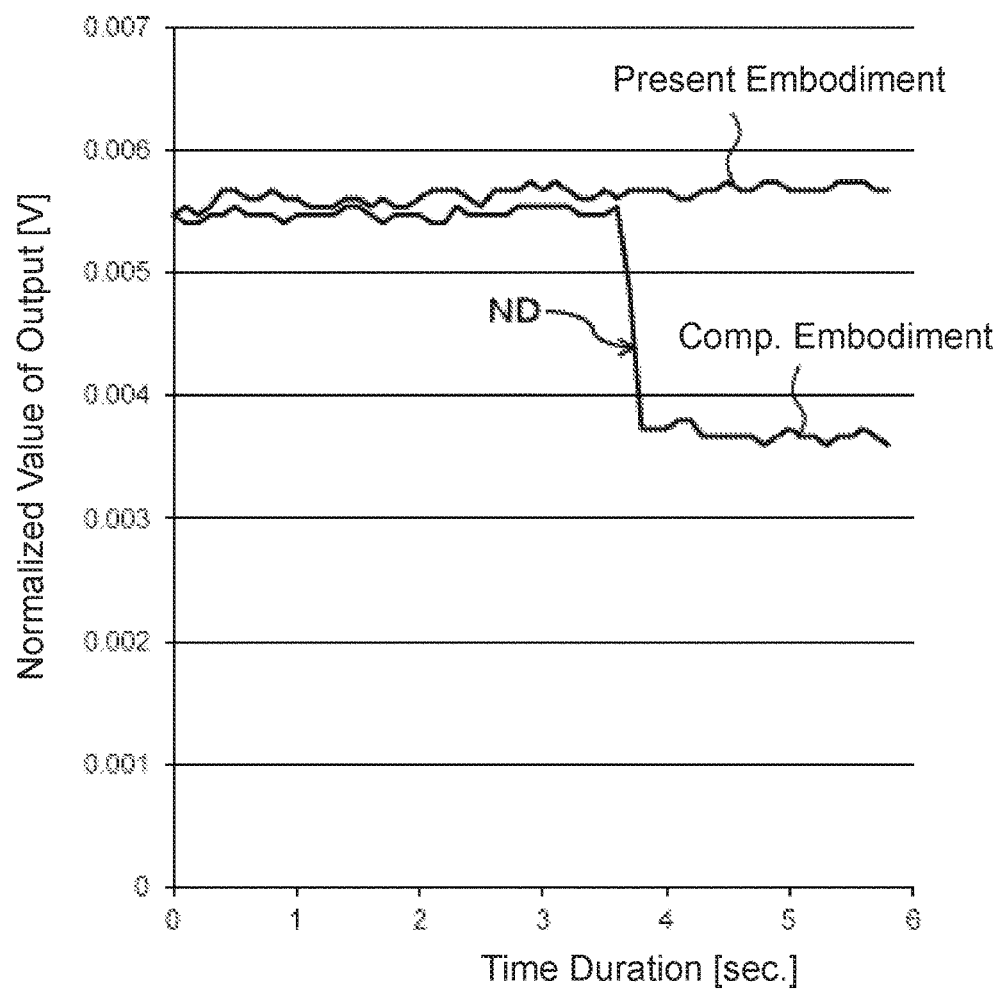
FIG. 4 is a graph showing the relationship between time duration for applying a magnetic field and a change in normalized outputs of the sensors of the embodiment (the first shape) and the comparative example.

Next, the effect of the present embodiment will be explained by comparing various shapes of the present embodiment, i.e., the first to fourth shapes (see FIGS. 2A to 2D), to a comparative example (see FIG. 3). The comparison is conducted based on the measurement of output of each magnetic sensor versus time duration for applying a magnetic field of a predetermined strength to each magnetic sensor in the second axis direction, as shown in the graph of FIG. 4. In the descriptions of the comparative example, when the same elements are used in the comparative example as in the present embodiment, the names and reference numerals in the present embodiment will be used.

The method of measurement will be explained with reference to FIG. 4

In the measurement, a magnetic field of a predetermined strength is applied to magnetic sensors 10 of the present embodiment in various shapes (the first to fourth shapes) and magnetic sensor 10A of the comparative example in the second axis direction. The outputs of magnetic sensors 10, 10A that are measured when the magnetic field is applied are recorded, for example, every 0.1 second. Then, the output spectra of magnetic sensors 10, 10A are compared to each other. The spectrum of magnetic sensor 10 of the present embodiment of the first shape and the spectrum of magnetic sensor 10A of the comparative example are shown in the graph of FIG. 4. In FIG. 4, output spectra are normalized such that half the difference between the maximum values and the minimum values of the outputs of respective magnetic sensors 10, 10A are 1.

It is preferable that a magnetic sensor having a magnetically sensitive axis in the X axis direction ideally outputs zero when a magnetic field is applied in the second axis direction. Actually, however, when a magnetic field is applied to the magnetic sensor in the second axis direction, each soft magnetic body 30 is considered to be magnetized in the second axis direction and additionally magnetized in the first axis direction in an unstable manner. Due to the magnetization that is directed in the first axis direction, unstable magnetic field component Bx that is directed in the first axis direction is applied to element portion 20. Thus, the magnetic sensor generates an output that is affected by the application of magnetic field component Bx. In other words, for each magnetic sensor 10, 10A, each spectrum in FIG. 4 corresponds to output noise that is caused by the magnetic field applied in the second axis direction.

Accordingly, it is preferable that the output spectrum of each magnetic sensor 10, 10A be as flat as possible with regard to the time duration. It is further preferable that the output be as low as possible, that is, as close to zero as possible. In the following descriptions, the output noise that is caused by the magnetic field applied in the second axis direction is simply referred to as "output noise".

The configuration of magnetic sensor 10A of the comparative example will be explained in detail with reference to FIG. 3. Both tip ends of end portions 34A of magnetic sensor 10A of the comparative example with regard to the long axis direction thereof are planes that extend in the short axis direction thereof. The width of each end portion 34A of the comparative example is the same as the width W of central portion 32A. Accordingly, unlike the present embodiment (see FIG. 1C), the width of each end portion 34A of the comparative example does not gradually decrease as the distance in the long axis direction from central portion 32A increases. Magnetic sensor 10A of the comparative example has the same configuration as magnetic sensor 10 of the present embodiment (see FIG. 1C) except for the above.

Referring to the graph of FIG. 4, the output of the comparative example is sharply changed several seconds after the measurement started (in the graph of FIG. 4, three to four seconds after the measurement started). In other words, a jump occurs in the output spectrum. The "spectrum jump" is indicated by the reference sign ND in FIG. 4. Consideration about the output will be given after the explanation about the measurements of the present embodiment.

In the present descriptions, output noise whose output, which is normalized in the aforementioned manner, is changed at a rate of 0.001 or more per 0.1 (second), i.e., output noise whose output, which is normalized in the aforementioned manner, is changed at a rate of 0.1(%) or more per 0.1 (second) is defined to be the "spectrum jump ND" mentioned above.

Next, explanation will be given about the output spectra of the present embodiments, i.e., the first to fourth shapes (see FIGS. 2A to 2D).

An output spectrum of magnetic sensor 10 having end portions 34 of the first shape (see FIGS. 1C, 2A) was observed, as shown in FIG. 4. Spectrum jump ND in the output spectrum, which was observed in the comparative example, was not observed, as shown in the graph of FIG. 4.

An output spectrum of magnetic sensor 10 having end portions 34 of the second shape (see FIG. 2B) was observed (not shown). The output spectrum was similar to the output spectrum of the first shape. In other words, spectrum jump ND in the output spectrum, which was observed in the comparative example, was not observed in the second shape. Each parameter in formula (2) for magnetic sensor 10 having end portions 34 of the second shape is set to be as follows.

W=2000 (nm)
L=2000 (nm)
P=0 (°)

An output spectrum of magnetic sensor 10 having end portions 34 of the third shape (see FIG. 2C) was observed (not shown). The output spectrum was similar to the output spectra of the first and second shapes. In other words, spectrum jump ND in the output spectrum, which was observed in the comparative example, was not observed in the third shape. Each parameter in formula (2) for magnetic sensor 10 having end portions 34 of the third shape is set to be as follows.

W=2000 (nm)
L=2000 (nm)
P=−20 (°)

An output spectrum of magnetic sensor 10 having end portion 34 of the fourth shape (see FIG. 2D) was observed (not shown). The output spectrum was similar to the output spectrum of the first shape. In other words, spectrum jump ND in the output spectrum, which was observed in the comparative example, was not observed in the fourth shape. The output spectrum of the fourth shape was less flat than the output spectra of the second and third shapes. Each parameter in formula (2) for magnetic sensor 10 having end portions 34 of the fourth shape is set to be as follows.

W=2000 (nm)
L=2000 (nm)
P=20 (°)

Next, consideration will be given based on the comparison of the output spectra between the embodiments in various shapes, i.e., the first to fourth shapes, and the comparative example.

Spectrum jump ND was not observed in the output spectra of the embodiments in various shapes, i.e., the first to fourth shapes, unlike the comparative example. Further, the output spectra of the embodiments in various shapes, i.e., the first to fourth shapes are flatter than the output spectrum of the comparative example. The inventor thinks that the reason is as follows.

In the comparative example, the width of end portion 34A of soft magnetic body 30A (see FIG. 3) does not gradually decrease from central portion 32 toward the tip end as the distance from central portion 32 in the long axis direction increases (the width of the tip end is not zero) and the tip end is a flat plain that extends in the short axis direction of element portion 20. Thus, unstable magnetic field component Bx that is directed from outward to inward in the short axis direction is considered to occur in end portions 34A, as shown in the enlarged view of end portion 34A in FIG. 3.

To the contrary, in the embodiments in various shapes, unlike the comparative example, end portions 34 (see FIGS. 2A to 2D) of soft magnetic body 30A gradually narrow from central portion 32 toward the tip ends as the distance from central portion 32 in the long axis direction increases (the width of the tip end is zero). Thus, in end portions 34 of the embodiments in various shapes, unstable magnetic field component Bx (see FIG. 3) that is directed from outward to inward in the short axis direction of end portion 34A is less apt to occur, as compared to end portions 34A of the comparative example, and even if it occurs, it is smaller than that of the comparative example. As a result, spectrum jump ND that was observed in the comparative example was not observed in the output spectra of the embodiments, as shown in FIG. 4.

Accordingly, magnetic sensor 10 of the present embodiment is capable of reducing output noise or limiting spectrum jump ND while enhancing sensitivity. This effect is especially advantageous in the present embodiment, in which the width of soft magnetic body 30 is larger than width W0 of element portion 20, because the output noise tends to increase. Furthermore, this effect is especially advantageous in the present embodiment, because S/N ratio can be improved when element portion 20 has a tunneling magnetoresistive effect.

Figure 2D:
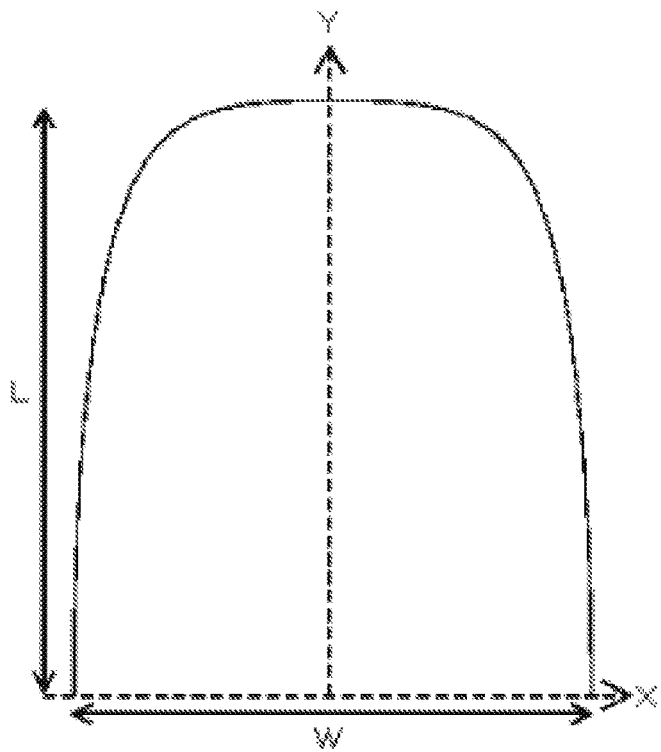

In addition, as mentioned above, the second shape (FIG. 2B) and the third shape (FIG. 2C) show flatter output spectra or small changes in output than the fourth shape (FIG. 2D). The inventor thinks that this is because the second and third shapes have a larger rate of change in the width of end portion 34 than the fourth shape, although the second to fourth shapes have the same length L of end portion 34.

A specific embodiment of the invention has been described. However, the present invention is not limited to the embodiment mentioned above. For example, the following modifications are included in the scope of the present invention.

Figure 5A:
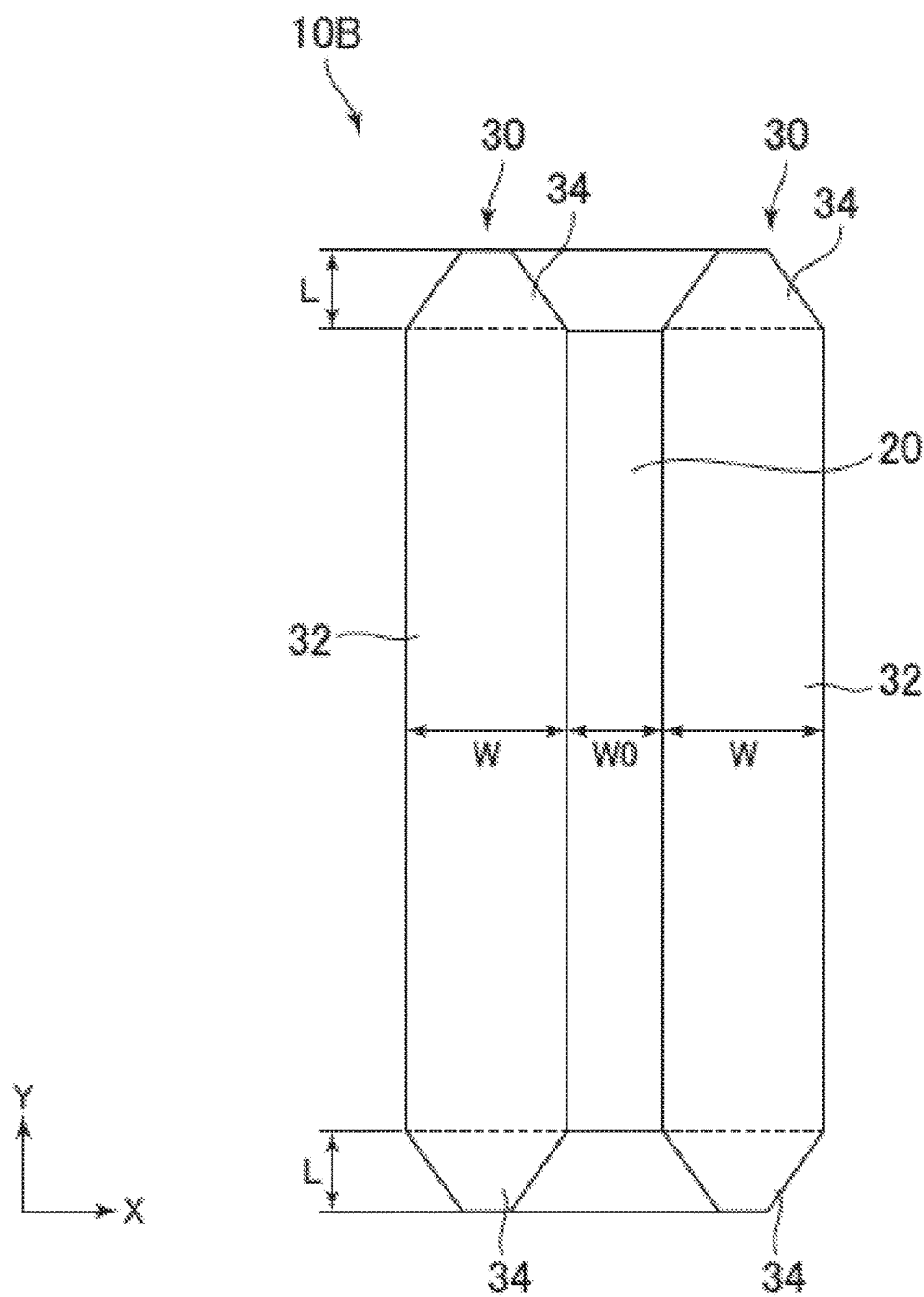
FIG. 5A to 5F are partial plan views of the main portions of magnetic sensors according to first to sixth modifications, respectively.

For example, in the embodiment, the width of end portion 34 of soft magnetic body 30 gradually decreases as the distance in the long axis direction from central portion 32 increases and becomes zero at the tip end (see FIG. 1C). However, as shown in FIG. 5A illustrating magnetic sensor 10B of a first modification, the width of end portion 34 does not have to become zero at the tip end as long as the width of end portion 34 of soft magnetic body 30 gradually decreases as the distance in the long axis direction from central portion 32 increases. This modification is also capable of reducing output noise while enhancing sensitivity, as compared to the above-mentioned comparative example.

Figure 5B:
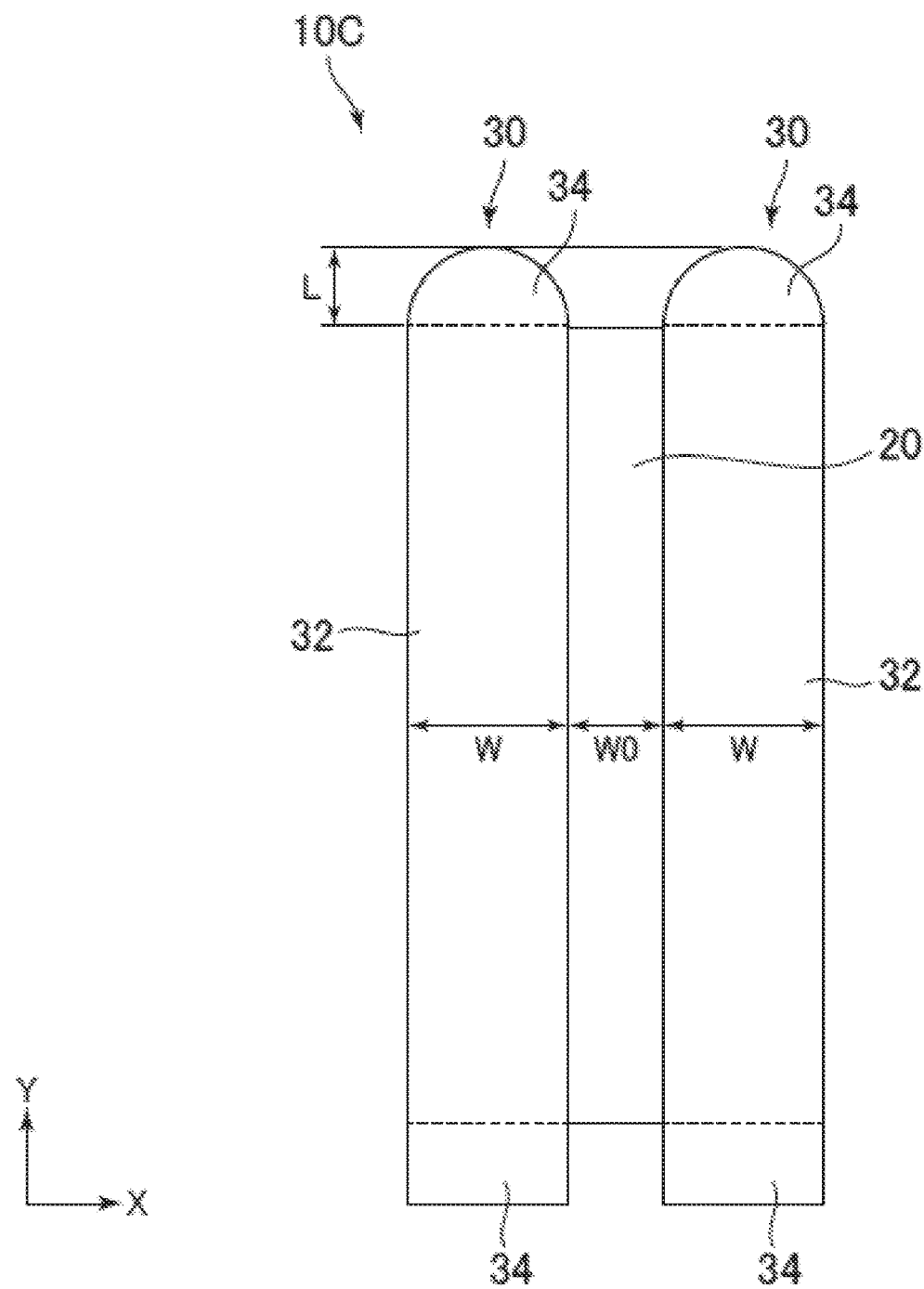

In the embodiment, the width of each end portion 34 of soft magnetic body 30 gradually decreases as the distance in the long axis direction from central portion 32 increases (see FIG. 1C). However, as shown in FIG. 5B illustrating magnetic sensor 10C of a second modification, the width of at least one of end portions 34 of soft magnetic body 30 may gradually decrease as the distance in the long axis direction from central portion 32 increases. This modification is also capable of reducing output noise while enhancing sensitivity, as compared to the above-mentioned comparative example.

Figure 5C:
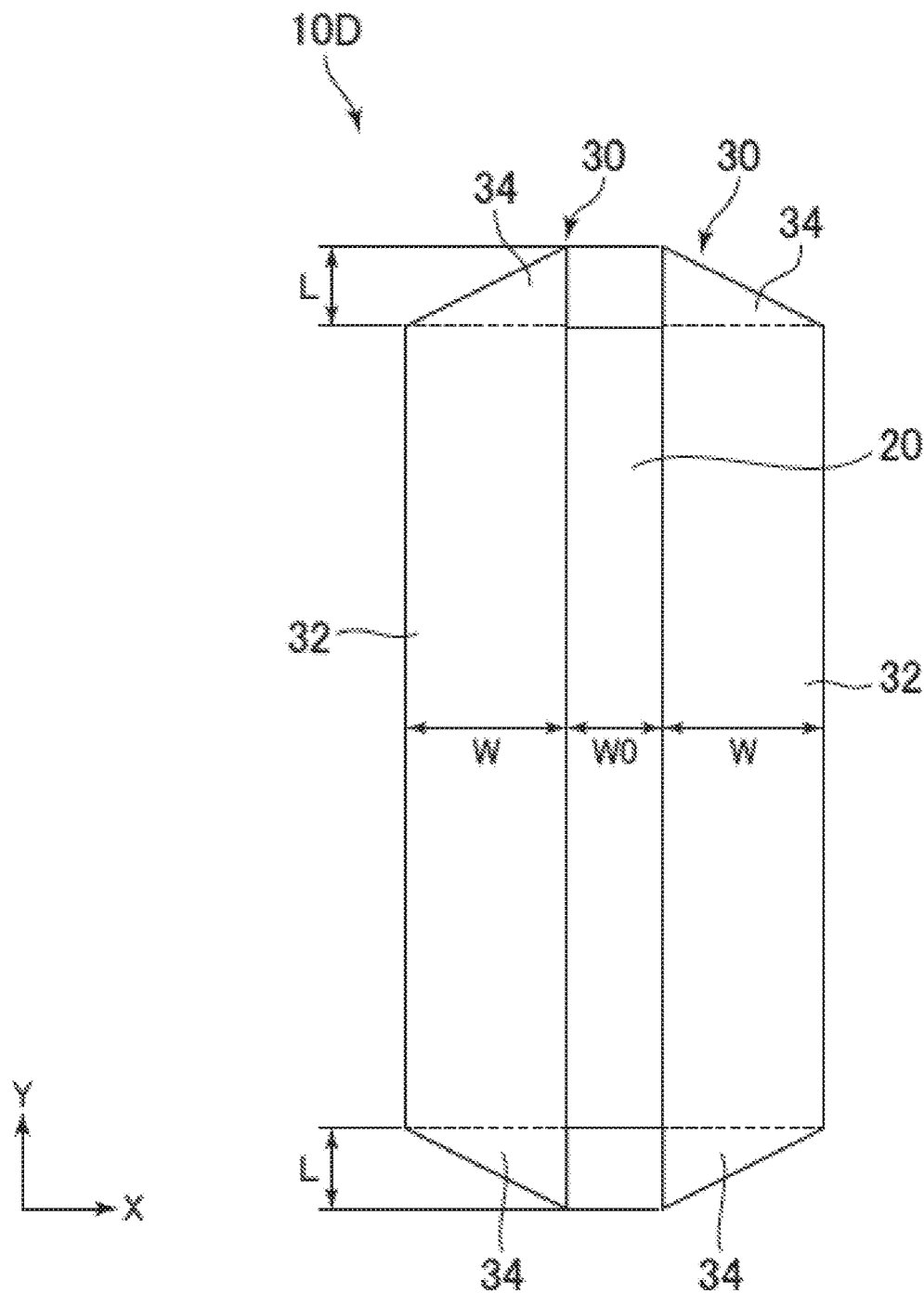

In the embodiment, each end portion 34 of soft magnetic body 30 is in line symmetry with regard to imaginary straight line L1 (see FIG. 1C). However, as shown in FIG. 5C illustrating magnetic sensor 10D of a third modification, each end portion 34 of soft magnetic body 30 does not have to be in line symmetry with regard to imaginary straight line L1 as long as the width of each end portion 34 of soft magnetic body 30 gradually decreases as the distance in the long axis direction from central portion 32 increases. This modification is also capable of reducing output noise while enhancing sensitivity, as compared to the above-mentioned comparative example.

Figure 5D:
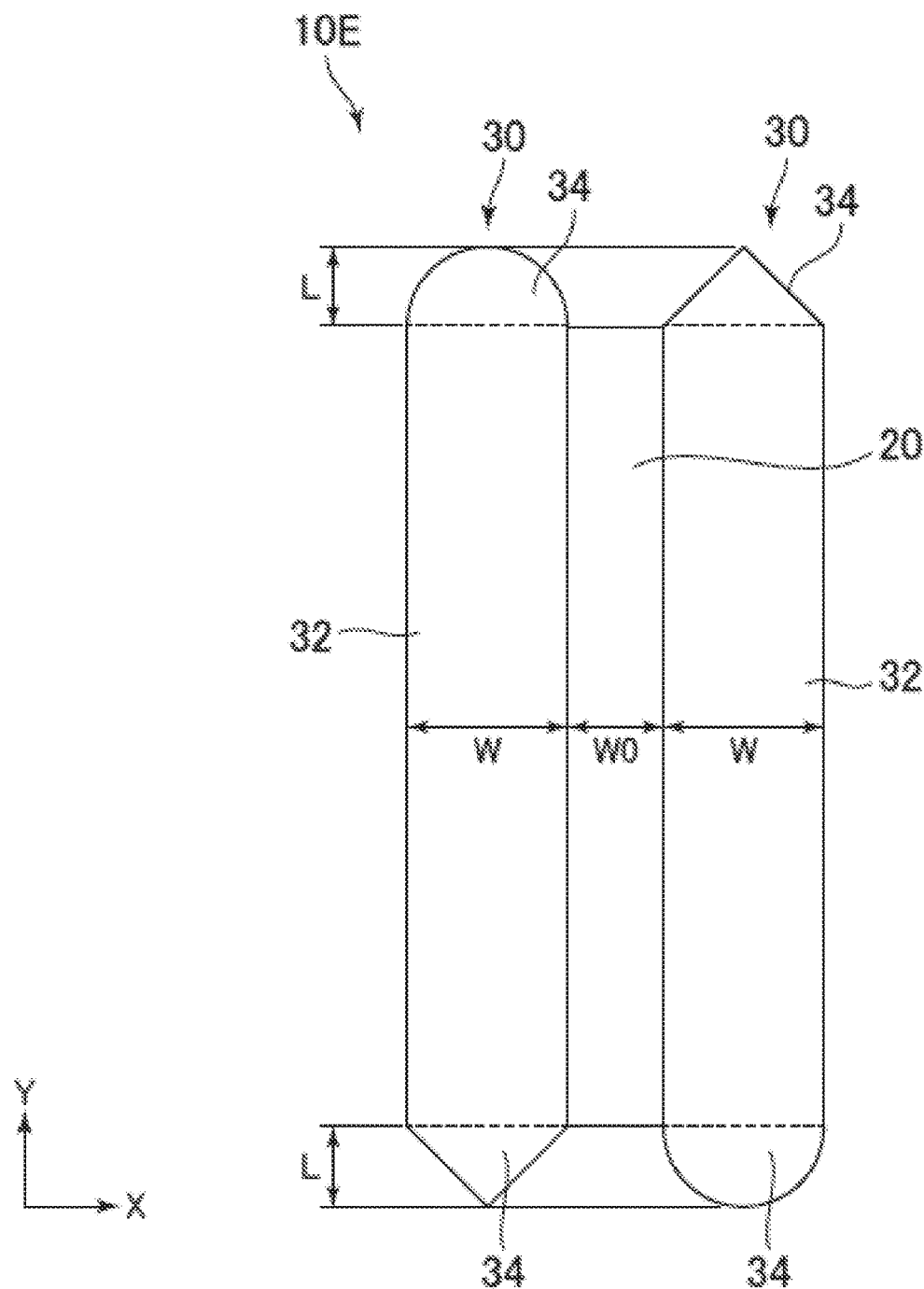

In the embodiment, end portions 34 of soft magnetic body 30 are in line symmetry with each other with regard to imaginary line L2 (see FIG. 1C). However, as shown in FIG. 5D illustrating magnetic sensor 10E of a fourth modification, end portions 34 of soft magnetic body 30 do not have to be in line symmetry with each other with regard to imaginary line L2 as long as the width of each end portion 34 of soft magnetic body 30 gradually decreases as the distance in the long axis direction from central portion 32 increases. This modification is also capable of reducing output noise while enhancing sensitivity, as compared to the above-mentioned comparative example.

Figure 5E:
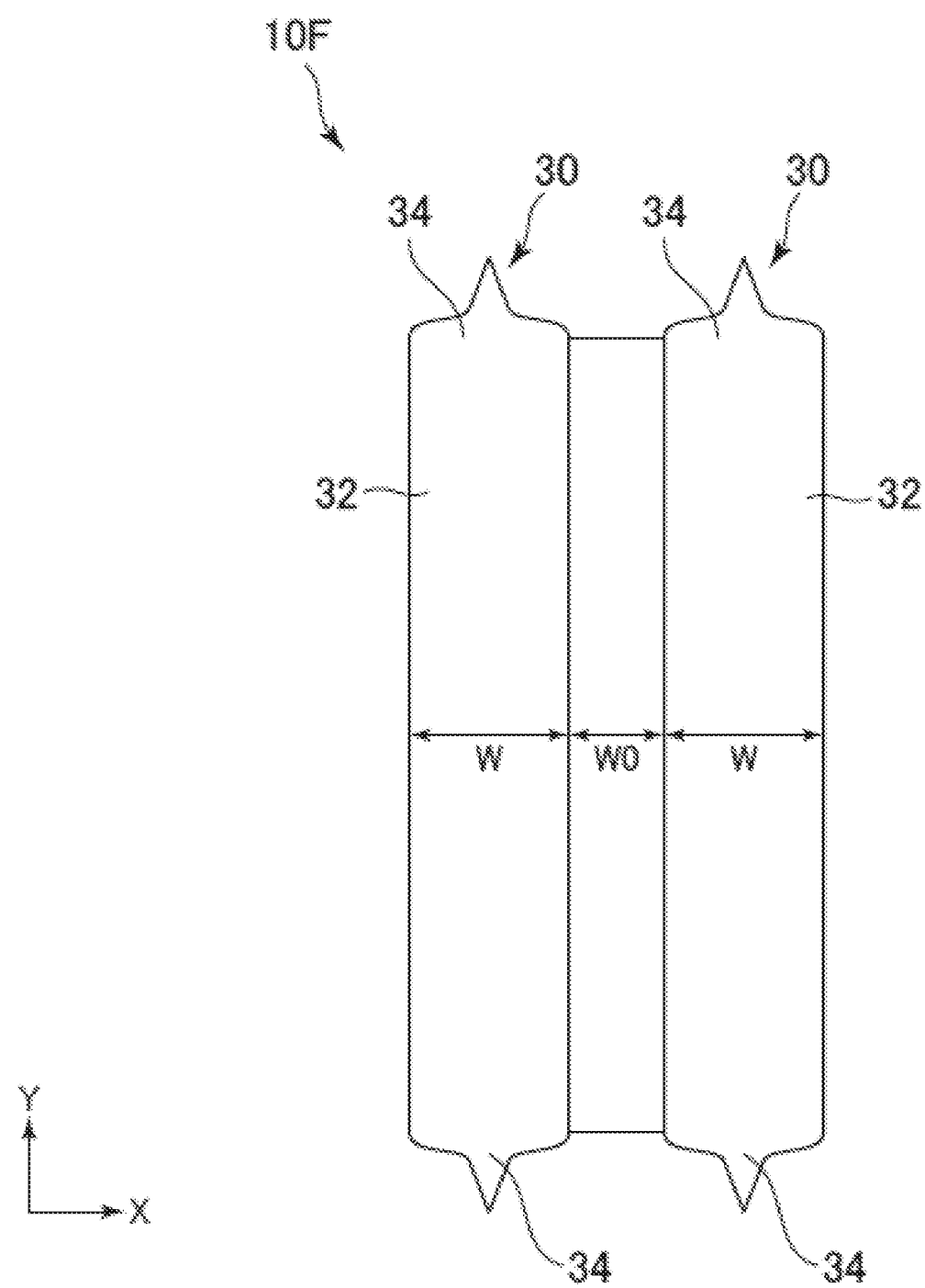

As shown in FIG. 5E illustrating magnetic sensor 10F of a fifth modification, the rate of decrease (change) in the long axis direction of the width of each end portion 34 may vary as long as the width of each end portion 34 gradually decreases as the distance in the long axis direction from central portion 32 increases. This modification is also capable of reducing output noise while enhancing sensitivity, as compared to the above-mentioned comparative example.

Figure 5F:
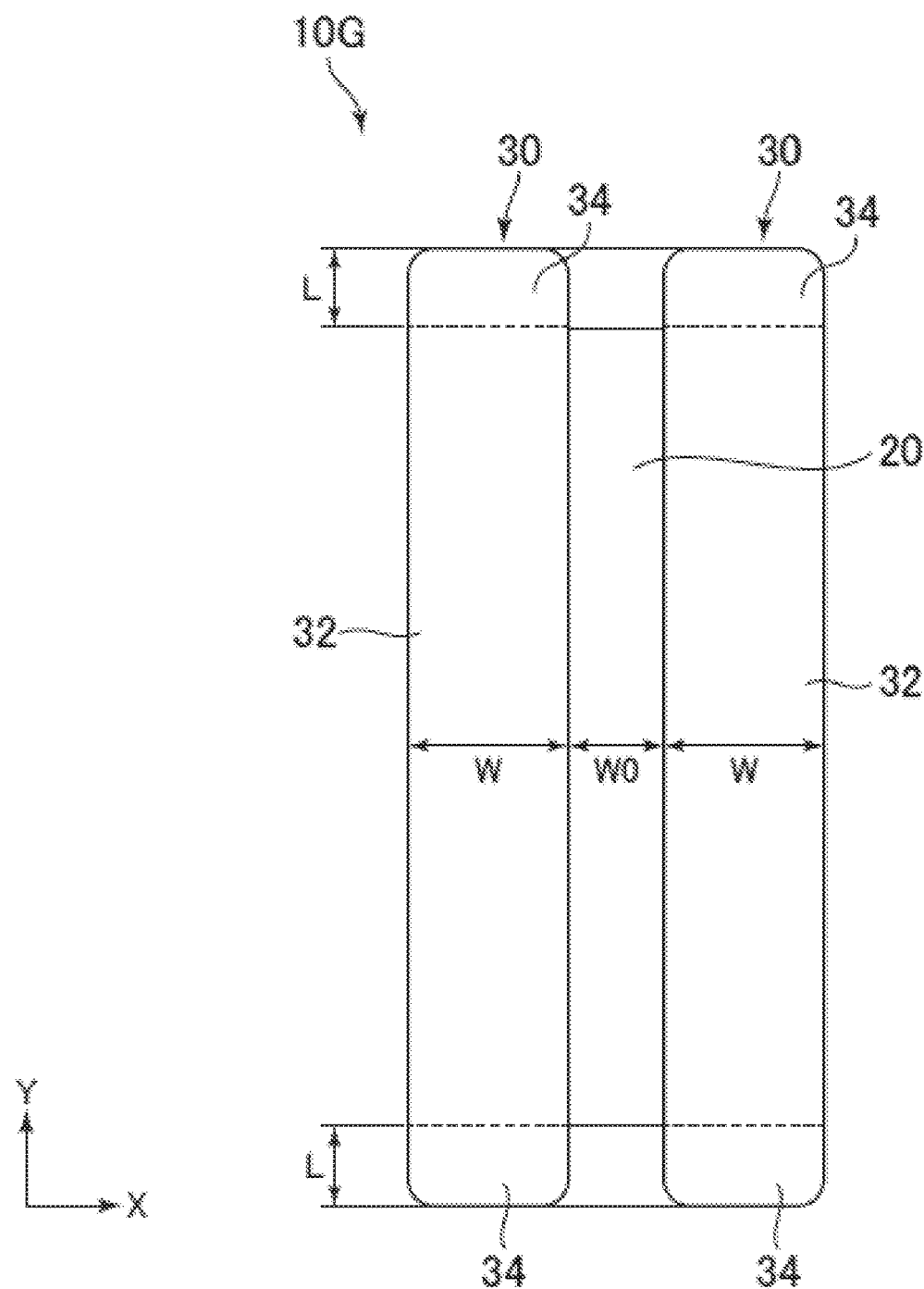

In the embodiment and the first modification etc., the widths of end portions 34 of soft magnetic body 30 gradually decrease as the distance in the long axis direction from central portion 32 (or the boundary between end portion 34 and central portion 32) increases (see FIGS. 1C and 5A). However, as shown in FIG. 5F illustrating magnetic sensor 10G of a sixth modification, the widths of end portions 34 of soft magnetic body 30 do not have to gradually decrease from the boundary with central portion 32 to the tip ends as the distance in the long axis direction from central portion 32 increases, as long as the width of end portion 34 of soft magnetic body 30 gradually decreases in a direction away from central portion 32 in at least a part of end portion 34 in the long axis direction thereof. This modification is also capable of reducing output noise while enhancing sensitivity, as compared to the above-mentioned comparative example.

Chamfering rate R of end portion 34 is, for example, 5(%) or more in the embodiment, and the embodiment and any modification that meets this requirement is capable of reducing output noise while enhancing sensitivity, as compared to the above-mentioned comparative example. However, taking into account the consideration mentioned above, any modification having chamfering rate R of less than 5(%) (not shown) shows an effect that is similar to the effect of the embodiment as long as the widths of end portions 34 of soft magnetic body 30 gradually decrease from the side of central portion 32 to the tip ends as the distance in the long axis direction from central portion 32 increases.

In the embodiment, the spacer layer that constitutes element portion 20 is a tunneling barrier layer, and element portion 20 is a TMR element. However, the spacer layer that constitutes element portion 20 may be a nonmagnetic conductive layer that is formed of a nonmagnetic metal, such as Cu, in order to form element portion 20 as a giant magnetoresistive element (GMR element). Element portion 20 may also be an anisotropic magnetoresistive element (AMR element). These modifications are also capable of reducing output noise while enhancing sensitivity, as compared to the comparative example.

In the embodiment, the width of central portion 32 of soft magnetic body 30 is larger than width W0 of element portion 20 (see FIG. 1C). However, the width of central portion 32 of soft magnetic body 30 may be equal to or smaller than width W0 of element portion 20 (not shown). Taking into account the fact that output noise occurs as a trade-off for enhancing the sensitivity of magnetic sensor 10 by providing soft magnetic body 30, the modification also has the effect of the above-mentioned embodiment.

An embodiment in which one from among the embodiment and the first to sixth modifications is combined with an element of other embodiment/modifications is also included in the scope of the present invention. For example, a modification of magnetic sensor 10B according to the first modification (see FIG. 5A), in which one of soft magnetic bodies 30 is replaced with one of soft magnetic bodies 30 according to the third modification, is included in the scope of the present invention.

Magnetic sensor 10 of the embodiment has been described by taking a position sensor as an example. However, magnetic sensor 10 of the embodiment may be a sensor other than a position sensor as long as magnetic sensor 10 detects a magnetic field that is applied in the first axis direction. For example, magnetic sensor 10 may be a sensor, such as an angle sensor, an encoder or the like.

Although certain preferred embodiments of the present invention have been shown and described in detail, it should be understood that various changes and modifications may be made without departing from the spirit or scope of the appended claims.

What is claimed is:

1. A magnetic sensor comprising:
    an elongate element portion having a magnetoresistive effect; and
    a pair of elongate soft magnetic bodies that are arranged along the elongate element portion on both sides of the elongate element portion with regard to a short axis thereof,
    wherein each soft magnetic body includes a central portion that is adjacent to the elongate element portion from one end to another end of the elongate element portion with regard to a long axis direction thereof and a pair of end portions that protrude from the central portion in the long axis direction,
    as viewed in a direction that is perpendicular both to the long axis direction and to a short axis direction of the soft magnetic body, the central portion is rectangular, an entire edge of at least one of the end portions is formed by a curved line, and a width of the at least one of the end portions gradually decreases in a direction away from the central portion in the long axis direction thereof from a boundary between the end portion and the central portion, and
    a relationship W/2≤L is satisfied where W is a width of the central portion and L is a protruding length of the end portion from the boundary between the end portion and the central portion.

2. The magnetic sensor according to claim 1, wherein the width of said one of the end portions is zero at a tip end thereof.

3. The magnetic sensor according to claim 1, wherein the widths of both end portions gradually decrease in a direction away from the central portion in at least a part of the end portions in the long axis direction thereof.

4. The magnetic sensor according to claim 3, wherein the widths of both end portions are zero at both tip ends thereof.

5. The magnetic sensor according to claim 1, wherein the width of the end portion gradually decreases from a boundary between the central portion and the end portion as a distance in the long axis direction from the central portion increases.

6. The magnetic sensor according to claim 1, wherein a chamfering rate of the end portion is 5% or more, as viewed in a direction that is perpendicular both to the long axis direction and to the short axis direction, wherein the chamfering rate is defined by S1/S2×100 (%), wherein S2 is an area of a minimum rectangular region that envelops the end portion and S1 is a value obtained by subtracting an area of the end portion from the area of the minimum rectangular region.

7. The magnetic sensor according to claim 1, wherein the end portion is in line symmetry with regard to the long axis direction of the elongate element portion, as viewed in a direction that is perpendicular both to the long axis direction and to the short axis direction.

8. The magnetic sensor according to claim 1, wherein a width of the central portion is larger than a width of the elongate element portion.

9. The magnetic sensor according to claim 1, wherein the elongate element portion exhibits a tunneling magnetoresistive effect.

10. The magnetic sensor according to claim 1, wherein the elongate element portion exhibits a giant magnetoresistive effect.

11. The magnetic sensor according to claim 1, wherein the elongate element portion has a magnetically sensitive axis in the short-axis direction.

12. The magnetic sensor according to claim 11, wherein the central portions of both soft magnetic bodies are adjacent to the elongate element portion on both sides of the elongate element portion with regard to the short-axis direction and are adjacent to the elongate element portion along the elongate element portion.

13. A magnetic sensor comprising:
an elongate element portion having a magnetoresistive effect; and
a pair of elongate soft magnetic bodies that are arranged along the elongate element portion on both sides of the elongate element portion with regard to a short axis thereof, wherein
each soft magnetic body includes a central portion that is adjacent to the elongate element portion from one end to another end of the elongate element portion with regard to a long axis direction thereof and a pair of end portions that protrude from the central portion in the long axis direction,
a width of at least one of the end portions gradually decreases in a direction away from the central portion in at least a part of the end portions in the long axis direction thereof,
an edge of the end portion is expressed by a first curve in a first quadrant of a Cartesian coordinate and by a second curve in a second quadrant of the Cartesian coordinate, as viewed in a direction that is perpendicular both to the long axis direction and to the short axis direction,
in the Cartesian coordinate, an origin (0,0) represents coordinates of a middle point of an imaginary boundary line between the end portion and the central portion, an X axis is the imaginary boundary line and a Y axis is an imaginary straight line that passes through the coordinates of the middle point and that extends in the long axis direction, and
the first curve is expressed by the following formula and the second curve is in line symmetry with the first curve with regard to the Y axis:

$$(X, Y) = (W/2 \times \cos\theta,\ L \times \sin(\theta + P \times \sin(2\theta))) \qquad \text{(formula 2)}$$

where
W: a width of the central portion
L: a length of the end portion
P: a strain angle
θ: an angle in the Cartesian coordinate system.

14. The magnetic sensor according to claim 13, wherein a length of the end portion in the long axis direction is equal to or less than a width of the central portion, and the strain angle is −20° or more and +30° or less.

* * * * *